United States Patent [19]
Abkowitz et al.

[11] Patent Number: 5,856,013
[45] Date of Patent: Jan. 5, 1999

[54] OHMIC CONTACT-PROVIDING COMPOSITIONS

[76] Inventors: Martin A. Abkowitz, 1198 Gatestone Cir., Webster, N.Y. 14580; Frederick E. Knier, Jr., 8358 Graves Point Rd., Wolcott, N.Y. 14590; Ihor W. Tarnawskyj, 753 Blue Creek Dr., Webster, N.Y. 14580; Milan Stolka, 14 Park Circle Dr., Fairport, N.Y. 14450; Joseph Mammino, 59 Bella Dr.; Kock-Yee Law, 27 Valewood Run, both of Penfield, N.Y. 14526

[21] Appl. No.: 786,614

[22] Filed: Jan. 21, 1997

[51] Int. Cl.$^6$ .......................... B32B 27/08; B32B 27/20; B32B 27/28; G03G 15/04
[52] U.S. Cl. .......................... 428/412; 428/323; 428/421; 428/422; 345/39; 345/46; 345/82; 362/800; 430/57; 430/58; 430/59; 430/60; 430/62; 430/63; 430/66; 430/67; 430/69; 430/96; 257/40; 257/103
[58] Field of Search ..................... 428/323, 421, 428/422, 412; 430/56, 57, 58, 59, 60, 62, 63, 66, 67, 69, 96; 345/82, 39, 46; 362/800; 257/40, 103

[56] References Cited

U.S. PATENT DOCUMENTS

| | | | |
|---|---|---|---|
| 4,265,990 | 5/1981 | Stolka et al. | 430/59 |
| 4,338,222 | 7/1982 | Limburg et al. | 252/500 |
| 4,515,882 | 5/1985 | Mammino et al. | 430/58 |
| 5,112,708 | 5/1992 | Okunuki et al. | 430/31 |
| 5,344,733 | 9/1994 | Suzuki et al. | 430/58 |
| 5,408,109 | 4/1995 | Heeger et al. | 257/40 |
| 5,587,110 | 12/1996 | Yamana et al. | 252/511 |
| 5,719,589 | 2/1998 | Norman et al. | 345/82 |

OTHER PUBLICATIONS

Journal of Imaging Science and Technology, vol. 40, No. 4, Jul./Aug. 1996 entitled Dark Injecton as a Probe of Interfacial Processes in Disordered Molecular Systems, Author: Martin A. Abkowitz.

*Primary Examiner*—Vivian Chen
*Attorney, Agent, or Firm*—Annette L. Bade

[57] ABSTRACT

Electrical components comprising a ohmic contact-providing layer and a charge transport layer wherein the ohmic contact-providing layer comprises a fluorinated carbon filled fluoropolymer.

27 Claims, 4 Drawing Sheets

OHMIC CONTACT-PROVIDING COMPOSITIONS

CROSS REFERENCE TO RELATED APPLICATIONS

Attention is directed to the following applications and patents assigned to the assignee of the present application: U.S. application Ser. No. 08/672,803, filed Jun. 24, 1996; U.S. application Ser. No. 08/635,356, filed Apr. 16, 1996; U.S. application Ser. No. 08/779,287, filed Jan. 21, 1997, now U.S. Pat. No. , 5,761,595; U.S. application Ser. No. 08/706,057, filed Aug. 30, 1996, now U.S. Pat. No. 5,765,085; and U.S. application Ser. No. 08/706,387, filed Aug. 30, 1996, now U.S. Pat. No. 5,837,340.

BACKGROUND OF THE INVENTION

The present invention relates to an electrically conducting polymer composition or ohmic contact-providing composition comprised of a fluorinated carbon filled fluoropolymer. The ohmic contact is useful as a coating for hole transport layers, and especially, for aromatic amine hole transport layers, reference for example U.S. Pat. No. 4,265,990. In an embodiment, the ohmic contact-providing composition is coated onto a hole transport layer, thereby forming a perfect hole injecting or ohmic contact to that layer. As an alternative embodiment, the ohmic contact-providing composition can be coated onto a supporting substrate, and a transport layer can be coated on the composition. The composition can be selected as an injecting or ohmic contact for holes into materials which are capable of transporting electronic charge. The composition may be useful in any active organic device that depends for its operation on contact to an external circuit where the contact interface does not itself inhibit the supply of charge. The polymer composition ohmic systems, when coated or otherwise deposited onto a hole transporting layer yield the ohmic interface useful for optimum device performance. Further, the polymer compositions of the present invention, in embodiments, will retain ohmic contact with the same transport polymers even after the transport molecules or transport polymers have been rendered conductive by chemical modification. The compositions of the present invention are particularly useful for organic light emitting diode structures, field effect transistors, and any other active organic device that is capable of carrying an electrical current.

Substantial research has been conducted on finding compositions which form ohmic contact layers to media which efficiently transport charge. In general, it is difficult to make stable ohmic contact to organic insulators and semiconductors. Problems encountered in providing an ohmic contact to organic media arise from intrinsic effects like interfacial energy mismatch as well as incompatibilities between the contacting surfaces associated with extrinsic factors like chemical contaminants. When there is such an energy mismatch or electrical incompatibility, the result is a decrease in the efficiency of the interfacial transfer of charge. In these so-called emission limited situations, the contact controls the supply of current which can limit device performance. Therefore, the desired situation is to have a perfect ohmic contact between the current source and the device to which the current is provided in order to obtain a 100% efficient current flow. In the latter case where the contact does not limit the supply of charge carriers to the bulk of the transport medium, the current is said to be bulk controlled.

The compositions of present invention have solved or minimized the above problems by providing an organic composition which, when coated onto or otherwise applied to a transport medium, supplies fully as much charge as the bulk of the transport medium can accommodate under the action of an applied electric field. In embodiments, the supply of electrical current is, therefore, not limited by the contact layer.

SUMMARY OF THE INVENTION

Examples of objects of the present invention include:

It is an object of the present invention to provide ohmic contact-providing compositions and methods thereof with many of the advantages indicated herein.

It is another object of the present invention to prepare available ohmic contact-providing compositions capable of supporting uninhibited supply of charge from an external circuit to an active organic device.

It is yet another object of the present invention to provide ohmic contactproviding compositions which provide maximum efficient contact to a hole transport layer.

It is further an object of the present invention to provide ohmic contactproviding compositions which retain their maximum efficient ability to supply charge to transport polymers or molecules even after these transport polymers have been rendered conductive by chemical modification.

Another object of the present invention is to provide ohmic contactproviding compositions which when inserted between metal and a transport or conducting layer provide an injecting interface.

A further object of the present invention is to provide ohmic contactproviding compositions which do not impede the flow of current from an electrical source to an operating device.

Another object of the present invention is to provide compositions which can be partially blocking, thereby allowing control over the current supplied to an adjacent charge transport layer, to any level demanded by the device application.

These and other objects have been met by the present invention in embodiments which include: a component comprising a charge transport layer and a fluorinated carbon filled fluoropolymer layer.

In addition, embodiments include: a conductor comprising: a) a substrate and thereover, b) an ohmic contact-providing layer comprising a fluorinated carbon filled fluoropolymer and thereon, c) a charge transport layer.

Further embodiments include: a conductor comprising a charge transporting layer and thereover, an ohmic contact-providing layer comprising a fluorinated carbon filled fluoropolymer.

Embodiments also include: a light emitting diode comprising: a) a substrate selected from the group consisting of semitransparent aluminum and semitransparent magnesium and thereover, b) an electron transport layer comprising a compound selected from the group consisting of 8-hydroxyquiniline aluminum, 2-biphenyl-5-p-t- butylphenyl oxadiazole, and derivatives thereof, and provided on the electron transport layer, c) an optional emitter layer comprising at least one fluorescent dye material and provided thereon, d) a hole transport layer comprising an alkyl amine/polycarbonate, and thereon, e) an ohmic contact-providing layer comprising a fluorinated carbon filled fluoropolymer, wherein the fluorinated carbon is of the formula $CF_x$, wherein x represents the number of fluorine atoms and is from about 0.02 to about 1.5.

Moreover, embodiments include: an ohmic contact-providing composition comprising a fluorinated carbon filled fluoroelastomer.

Additional embodiments include: a process for providing an ohmic contact comprising providing a substrate, and thereover a charge transport layer and a fluorinated carbon filled fluoroelastomer layer.

The ohmic contact-providing composition of the present invention, the embodiments of which are described further herein, provides ohmic contact in active organic devices that depends for its operation on neutral contact from an external circuit. Further, the ohmic contact-providing compositions herein, in embodiments, do not substantially impede the flow of current from an electrical source to an operating device.

BRIEF DESCRIPTION OF THE DRAWINGS

For a better understanding of the present invention, reference may be had to the accompanying figures.

DETAILED DESCRIPTION OF THE PRESENT INVENTION

Figure 1:
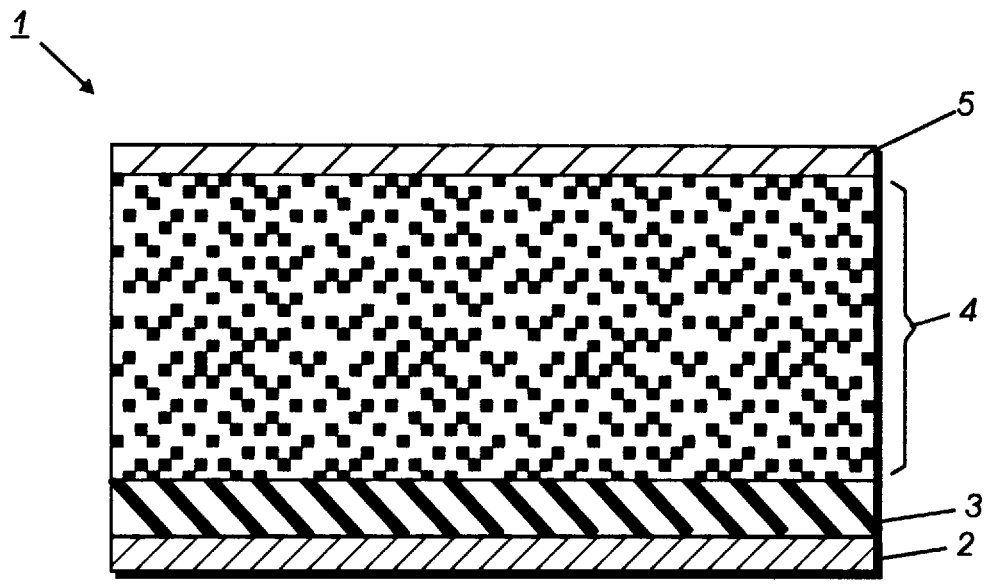
FIG. 1 depicts an embodiment of the present invention wherein a conductor comprises a supporting substrate overcoated with an ohmic contact-providing layer which is overcoated with a charge transport layer. An optional top surface collecting contact is present on the contact-providing layer.

The phrase "perfectly injecting" or the term "ohmic" as used herein means a composition that will act as an infinite charge reservoir and will have the ability at any specified electric field, to sustain the maximum hole current that the interfacing transport layer can accommodate, i.e. Space Charge Limited Current. The current injected into the hole transport layer by the composition ohmic contact is determined solely by the characteristics of the transport layer and is not limited by the ability of the injected contact to supply charge. The maximum dark current density that a given unipolar transport layer can accommodate depends on its drift mobility, bulk relaxation time and physical dimensions and on the applied electric field. For any given transport layer the composition of the composition coating can be tuned to assure its ohmic behavior.

By adjusting the composition of the layer (over a broad range) relative to the transport characteristics of a given transport layer, it is possible to make contact which is, depending on composition, either ohmic as defined above, or emission limited. The term "emission limited" as used herein means that the current through the transport layer is no longer solely controlled by its transport properties, but may be controlled by the rate that the contact is able to supply charge across the interface to the transport layer.

An ohmic contact is an electrical contact capable of satisfying the demands of the bulk transport layer for an injected charge. The demands include space charge limited (SCL) conditions. There are two operating regimes for an ohmic contact. First, for electric fields low enough to keep the injected carrier transit time (through the bulk of the transport layer) longer than the bulk dielectric relaxation time (the time required to locally neutralize any excess charge injected into the bulk), the ohmic contact supplies charge precisely to match the rate of extraction at the collecting contact thereby preserving the thermal equilibrium carrier population in the bulk. It is only when the latter conditions prevail that a measurement of current density divided by electric field yields the true bulk conductivity of the transport layer. Second, at fields high enough to make the injected carrier transit time less than the bulk relaxation time, only repulsive interactions among the transiting carriers and interactions with traps limit the magnitude of the injected carrier density and space charge limited conditions prevail. The current in this case is space-charge limited (SCL).

In the special case in which the unipolar transport layer contains no deep traps, the trap free space charge limited current (TFSCLC), in a given specimen of thickness L, takes the following simple form:

$$J_{(TFSCLC)} = 9/8 \epsilon \epsilon_0 \mu E^2 / L \qquad (1)$$

where J is the current (TFSCLC), $\epsilon$ is the relative dielectric constant, $\epsilon_0$ is the vacuum dielectric constant, $\mu$ is the drift mobility at the electric field E. It is important to note that if the transport layer is a near-perfect insulator, that is, it contains no free charge carriers under equilibrium conditions in the dark, then the bulk relaxation time is always longer than the transit time, and equation (1) describes the J versus E curve for an ohmic contact at all applied fields. Equation (1) states that under TFSCL conditions, the current injected into a transport layer of thickness L by an ohmic contact at an applied electric field E is uniquely determined by the drift mobility. This current is the maximum current that the bulk can sustain and represents the maximum demand for supply of charge across the contact transport layer interface. While an ohmic contact is defined as one which can satisfy this demand, an emission limited contact is defined as one which falls short of this requirement. Thus by definition, the emission limited (EL) current supplied $$J_{(EL)} < J_{(TFSCLC)} \qquad (2)$$

and $J_{(EL)}/J_{(TFSCLC)}$ is a quantitative measure of the relative injection efficiency of an EL contact.

Figure 3:
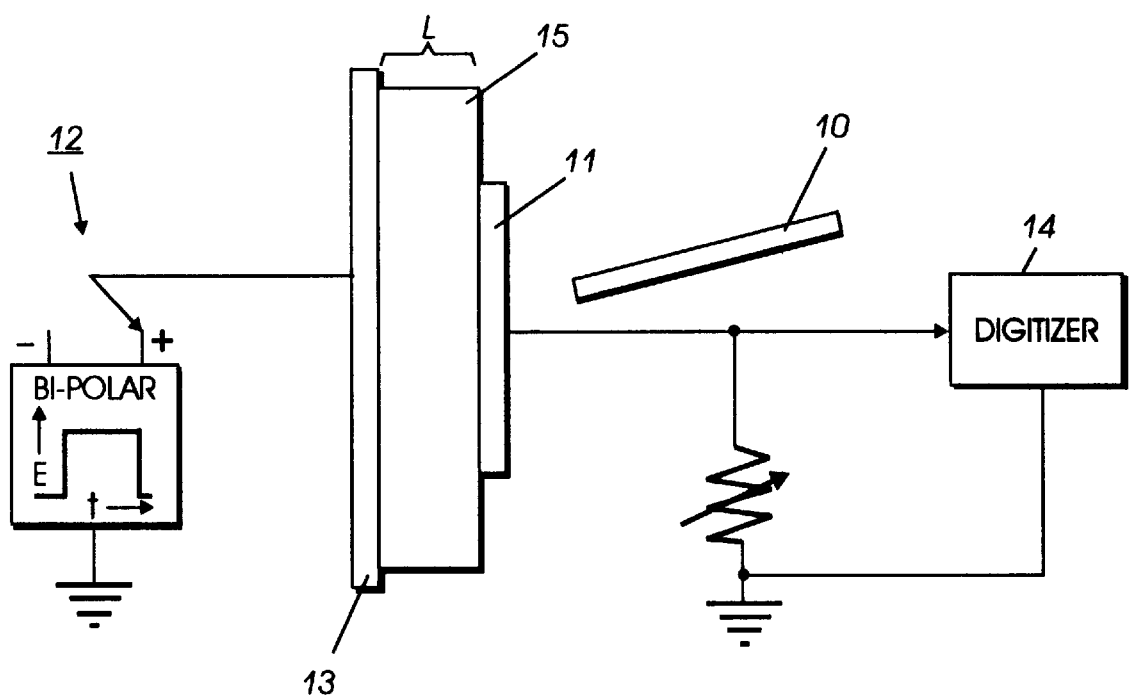
FIG. 3 depicts an apparatus used to establish contact ohmicity.

FIG. 3 demonstrates an experimental procedure used to classify contact behavior on a unipolar trap free transport medium. A trap free hole transport layer 15 (an example of which is a polymer of the following structure

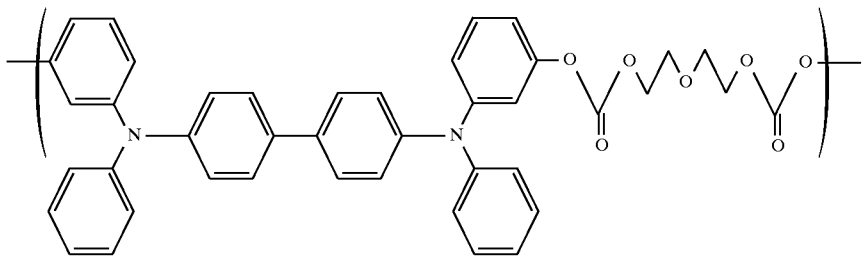

which is usually referred to in the scientific literature as PTPB) of thickness L is fitted with a semitransparent blocking contact 11 on one face and with the contact to be classified 13 on its opposite face. The semitransparent blocking contact 11 blocks the dark injection of the mobile sign carrier. The transport layer 15 is photoexcited with a weak pulse of 337 nm light through the semitransparent blocking contact 11 which has been biased positive relative to the opposite contact by application of a field E. The very low power pulsed laser output 10 at about 337 nm wavelength is strongly absorbed though the semitransparent blocking contact 11 under positive bias so that a drift mobility can be ascertained at that field. The weak pulse of 337 nm light is strongly absorbed close to the blocking contact 11 and generates a pulse of holes which transmit the bulk under the action of the applied field generating a signal in an external sensing resistor. A digitizer 14 is used to measure the current signal. The signal is analyzed to determine the drift mobility of holes at the applied field. The same positive bias 12 is then applied to the contact 13 under test without illumination and the steady state dc current is ascertained. This current is directly compared to the current calculated using equation (1) from the experimental hole drift mobility measured at field E in the same specimen. The procedure is repeated for the full range of applied fields. If the measured dark current density supplied by the contact under test coincides with the current calculated by substituting measured drift mobilities into equation (1), then the contact is ohmic by definition. If the measured hole dark current falls short of the calculated values, then the degree to which it falls short is a measure of the hole injection efficiency relative to an ohmic contact.

Figure 4:
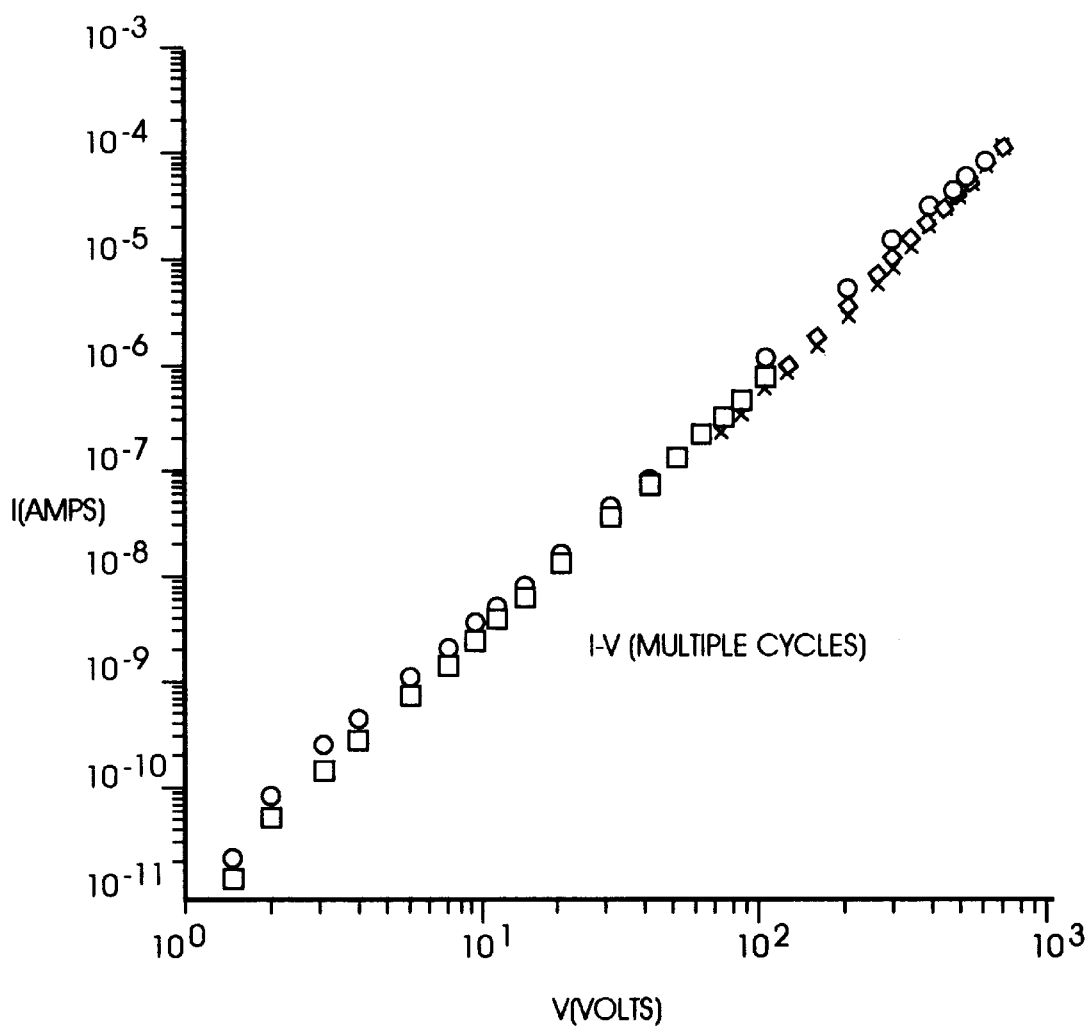
FIG. 4 is a graph of amps versus volts and depicts experimental results demonstrating contact ohmicity for hole injection into an alkyl amine/polycarbonate layer.

FIG. 4 shows the results of an experiment demonstrating contact ohmicity for hole injection into an alkyl amine/polycarbonate layer. The procedure illustrated in FIG. 3 was used. Specifically, a particular composition (30% ACCU-FLUOR® 2028 in VITON® GF layer) was deposited on a 50 wt % aryl amine (specifically, N,N'-diphenyl-N-N'-bis(3-methylphenyl)1,1'-biphenyl-4,4'-diamine)/polycarbonate transport layer. The results show that the composition can sustain trap free space charge limited current $J_{TFSCLC}$ and is therefore ohmic. The solid circles were calculated from drift mobility measurements and clearly superimpose on the dc current measured directly (crosses and squares), thereby satisfying the ohmicity criterion.

The particular resistivity and consequently the current supply efficiency of the contact composition can be chosen and controlled depending, for example, on the amount of fluorinated carbon, the kind of curative, the amount of curative, the amount of fluorine in the fluorinated carbon, and the curing procedures including the specific curing agent, curing time and curing temperature. Thus, the resulting contacts can range from perfectly ohmic to partially blocking to completely blocking, depending on the above-mentioned variables. The resistivity can be controlled not only by selecting the appropriate curing agents, curing time and curing temperature as set forth above, but also by selecting a specific polymer and filler, such as a specific fluorinated carbon, or mixtures of various types of fluorinated carbon. The percentage of fluorine in the fluorinated carbon will also affect the resistivity of the fluoropolymer when mixed therewith. The fluorinated carbon crosslinked with a fluoropolymer provides unexpectedly superior results by providing an ohmic contact composition having a stable resistivity within the desired range which is virtually unaffected by numerous environmental and mechanical changes.

Fluorinated carbon, sometimes referred to as graphite fluoride or carbon fluoride is a material resulting from the fluorination of carbon with elemental fluorine. The number of fluorine atoms per carbon atom may vary depending on the fluorination conditions. The variable fluorine atom to carbon atom stoichiometry of fluorinated carbon permits systemic, uniform variation of its resistivity and consequently, current limiting properties. Controlled resistivity is a necessary feature for an injecting contact.

Fluorinated carbon, as used herein, is a specific class of compositions which is prepared by the chemical addition of fluorine to one or more of the many forms of solid carbon. In addition, the amount of fluorine can be varied in order to produce a specific, desired resistivity. Fluorocarbons are either aliphatic or aromatic organic compounds wherein one or more fluorine atoms have been attached to one or more carbon atoms to form well defined compounds with a single sharp melting point or boiling point. Fluoropolymers are linked-up single identical molecules which comprise long chains bound together by covalent bonds. Moreover, fluoroelastomers are a specific type of fluoropolymer. Thus, despite some apparent confusion in the art, it is apparent that fluorinated carbon is neither a fluorocarbon nor a fluoropolymer and the term is used in this context herein.

The fluorinated carbon material may include the fluorinated carbon materials as described herein and other well-known fluorinated carbons. The methods for preparation of fluorinated carbon are well known and documented in the literature, such as in the following U.S. Pat. Nos. 2,786,874; 3,925,492; 3,925,263; 3,872,032 and 4,247,608, the disclosures each of which are totally incorporated by reference herein. Essentially, fluorinated carbon is produced by heating a carbon source such as amorphous carbon, coke, charcoal, carbon black or graphite with elemental fluorine at elevated temperatures, such as 150° to about 600° C. A diluent such as nitrogen is preferably admixed with the fluorine. The nature and properties of the fluorinated carbon vary with the particular carbon source, the conditions of reaction and with the degree of fluorination obtained in the final product. The degree of fluorination in the final product may be varied by changing the process reaction conditions, principally temperature and time. Generally, the higher the temperature and the longer the time, the higher the fluorine content.

Fluorinated carbon of varying carbon sources and varying fluorine contents is commercially available from several sources. Preferred carbon sources are carbon black, crystalline graphite and petroleum coke. One form of fluorinated carbon which is suitable for use in accordance with the invention is polycarbon monofluoride which is usually represented in the shorthand manner $CF_x$ with x representing the number of fluorine atoms and generally being up to about 1.5, preferably from about 0.01 to about 1.5, and particularly preferred from about 0.04 to about 1.4. The formula $CF_x$ has a lamellar structure composed of layers of fused six carbon rings with fluorine atoms attached to the carbons and lying above and below the plane of the carbon atoms. Preparation of $CF_x$ type fluorinated carbon is described, for example, in above-mentioned U.S. Pat. Nos. 2,786,874 and 3,925,492, the disclosures of which are incorporated by reference herein in their entirety. Generally, formation of this type of fluorinated carbon involves reacting elemental carbon with $F_2$ catalytically. This type of fluorinated carbon can be obtained commercially from many vendors, including Allied Signal, Morristown, N.J.; Central Glass International, Inc., White Plains, N.Y.; Diakin Industries, Inc., New York, N.Y.; and Advance Research Chemicals, Inc., Catoosa, Okla.

Another form of fluorinated carbon which is suitable for use in accordance with the invention is that which has been postulated by Nobuatsu Watanabe as poly(dicarbon monofluoride) which is usually written in the shorthand manner $(C_2F)_n$. The preparation of $(C_2F)_n$ type fluorinated carbon is described, for example, in above-mentioned U.S. Pat. No. 4,247,608, the disclosure of which is herein incorporated by reference in its entirety, and also in Watanabe et al., "Preparation of Poly(dicarbon monofluoride) from Petroleum Coke", Bull. Chem. Soc. Japan, 55, 3197–3199 (1982).

In addition, preferred fluorinated carbons selected include those described in U.S. Pat. No. 4,524,119 to Luly et al., the subject matter of which is hereby incorporated by reference in its entirety, and those having the tradename ACCUFLUOR®, (ACCUFLUOR® is a registered trademark of Allied Signal, Morristown, N.J.) for example, ACCUFLUOR® 2028, ACCUFLUOR® 2065, ACCUFLUOR® 1000, and ACCUFLUOR® 2010. ACCUFLUOR® 2028 and ACCUFLUOR® 2010 have 28 and 11 percent fluorine content, respectively. ACCUFLUOR® 1000 and ACCUFLUOR® 2065 have 62 and 65 percent fluorine content respectively. Also, ACCUFLUOR® 1000 comprises carbon coke, whereas ACCUFLUOR® 2065, 2028 and 2010 all comprise conductive carbon black. These fluorinated carbons are of the formula $CF_x$ and are formed by the reaction of $C+F_2=CF_x$.

The following chart data demonstrates some properties of four preferred fluorinated carbons (i.e., ACCUFLUOR® 1000, ACCUFLUOR® 2065, ACCUFLUOR® 2028 and ACCUFLUOR® 2010) selected for compositions of the present invention.

| PROPERTIES | ACCUFLUOR ® | | | | UNITS |
|---|---|---|---|---|---|
| GRADE | 1000 | 2065 | 2028 | 2010 | N/A |
| Feedstock | Coke | Conductive Carbon Black | | | N/A |
| Fluorine Content | 62 | 65 | 28 | 11 | % |
| True Density | 2.7 | 2.5 | 2.1 | 1.9 | g/cc |
| Bulk Density | 0.6 | 0.1 | 0.1 | 0.09 | g/cc |
| Decomposition Temperature | 630 | 500 | 450 | 380 | °C. |
| Median Particle Size | 8 | <1 | <1 | <1 | micrometers |
| Surface Area | 130 | 340 | 130 | 170 | m²/g |
| Thermal Conductivity | $10^{-3}$ | $10^{-3}$ | $10^{-3}$ | N.A. | cal/cm-sec-°C. |
| Electrical Resistivity | $10^{11}$ | $10^{11}$ | $10^{8}$ | <10 | ohm-cm |
| Color | Gray | White | Black | Black | N/A |

A major advantage of the composition is the capability to be able to vary the fluorine content of the fluorinated carbon to permit the desired resistivity properties required for ohmic or, when desired, partially blocking contact. The preferred fluorine content will depend, for example, on the equipment used, equipment settings, desired resistivity, and the specific fluoropolymer chosen. The fluorine content in the fluorinated carbon is from about 1 to about 70 weight percent based on the weight of fluorinated carbon (carbon content of from about 99 to about 30 weight percent), preferably from about 5 to about 65 (carbon content of from about 95 to about 35 weight percent), and particularly preferred from about 10 to about 30 weight percent (carbon content of from about 90 to about 70 weight percent).

The median particle size of the fluorinated carbon can be less than 1 micron and up to 10 microns, is preferably less than 1 micron, and particularly preferred from about 0.5 to about 0.9 micron. The surface area is preferably from about 100 to about 400 m²/g, preferred of from about 110 to about 340, and particularly preferred from about 130 to about 170 m²/g. The density of the fluorinated carbons is preferably from about 1.5 to about 3 g/cc, preferably from about 1.9 to about 2.7 g/cc.

The amount of fluorinated carbon in the fluoropolymer ohmic contact-providing composition is from about 1 to about 50 percent by weight of the total solids content, and preferably from about 5 to about 30 weight percent based on the weight of total solids. Total solids as used herein refers to the amount of fluoropolymer and/or other elastomers, fluorinated carbon, dehydrofluorinating agent, solvent, additives and fillers.

Different types of fluorinated carbon may be mixed in order to tune the electrical properties of the composition. For example, an amount of from about 0 to about 40 percent, and preferably from about 1 to about 35 percent by weight of ACCUFLUOR® 2010 can be mixed with an amount of from about 0 to about 40 percent, preferably from about 1 to about 35 percent ACCUFLUOR® 2028. Other forms of fluorinated carbon can also be mixed. Another example is an amount of from about 0 to about 40 percent ACCUFLUOR® 1000 mixed with an amount of from about 0 to about 40 percent, preferably from about 1 to about 35 percent ACCUFLUOR® 2065. All other combinations of mixing the different forms of ACCUFLUOR® are possible.

Preferred fluoropolymers include elastomers such as fluoroelastomers. Specifically, suitable fluoroelastomers are those described in detail in U.S. Pat. Nos. 5,166,031, 5,281, 506, 5,366,772 and 5,370,931, together with U.S. Pat. Nos. 4,257,699, 5,017,432 and 5,061,965, the disclosures each of which are incorporated by reference herein in their entirety. As described therein these fluoroelastomers, particularly from the class of copolymers and terpolymers of vinylidenefluoride, hexafluoropropylene and tetrafluoroethylene, are known commercially under various designations as VITON® A, VITON® E, VITON® E60C, VITON® E430, VITON® 910, VITON® GH and VITON® GF. The VITON® designation is a Trademark of E.I. DuPont de Nemours, Inc. Other commercially available materials include FLUOREL® 2170, FLUOREL® 2174, FLUO- REL® 2176, FLUOREL® 2177 and FLUOREL® LVS 76, FLUOREL® being a Trademark of 3M Company. Additional commercially available materials include AFLAS™ a poly(propylene-tetrafluoroethylene) and FLUOREL II® (LII900) a poly(propylenetetrafluoroethylenevinylidenefluoride) both also available from 3M Company, as well as the Tecnoflons identified as FOR-60KIR®, FOR-LHF®, NM® FOR-THF®, FOR-TFS®, TH®, TN505® available from Montedison Specialty Chemical Company. In another preferred embodiment, the fluoroelastomer is one having a relatively low quantity of vinylidenefluoride, such as in VITON® GF, available from E.I. DuPont de Nemours, Inc. The VITON® GF has 35 mole percent of vinylidenefluoride, 34 mole percent of hexafluoropropylene and 29 mole percent of tetrafluoroethylene with 2 percent cure site monomer. Examples of suitable cure site monomers include 4-bromoperfluorobutene-1; 1,1-dihydro-4-bromoperfluorobutene-1; 3-bromoperfluoropropene-1; 1,1-dihydro-3-bromoperfluoropropene-1; or any other suitable, known cure site monomer commercially available from DuPont or any other company.

Fluoroplastics can also be used herein as the fluoropolymer. Examples of suitable fluoroplastics polytetrafluoroethylene (PTFE), fluorinated ethylenepropylene copolymer (FEP), polyfluoroalkoxypolytetrafluoroethylene (PFA Teflon) and the like.

Other examples of suitable fluoroelastomers suitable for use herein include elastomers of the above type, along with volume grafted elastomers. Volume grafted elastomers are a special form of hydrofluoroelastomer and are substantially uniform integral interpenetrating networks of a hybrid composition of a fluoroelastomer and a polyorganosiloxane, the volume graft having been formed by dehydrofluorination of fluoroelastomer by a nucleophilic dehydrofluorinating agent, followed by addition polymerization by the addition of an alkene or alkyne functionally terminated polyorganosiloxane and a polymerization initiator. Examples of specific volume graft elastomers are disclosed in U.S. Pat. No. 5,166,031; U.S. Pat. No. 5,281,506; U.S. Pat. No. 5,366,772; and U.S. Pat. No. 5,370,931, the disclosures each of which are herein incorporated by reference in their entirety.

Volume graft, in embodiments, refers to a substantially uniform integral interpenetrating network of a hybrid composition, wherein both the structure and the composition of the fluoroelastomer and polyorganosiloxane are substantially uniform when taken through different slices of the composition material. A volume grafted elastomer is a hybrid composition of fluoroelastomer and polyorganosiloxane formed by dehydrofluorination of fluoroelastomer by nucleophilic dehydrofluorinating agent followed by addition polymerization by the addition of alkene or alkyne functionally terminated polyorganosiloxane.

Interpenetrating network, in embodiments, refers to the addition polymerization matrix where the fluoroelastomer and polyorganosiloxane polymer strands are intertwined in one another.

Hybrid composition, in embodiments, refers to a volume grafted composition which is comprised of fluoroelastomer and polyorganosiloxane blocks randomly arranged.

Generally, the volume grafting according to the present invention is performed in two steps, the first involves the dehydrofluorination of the fluoroelastomer preferably using an amine. During this step, hydrofluoric acid is eliminated which generates unsaturation, carbon to carbon double bonds, on the fluoroelastomer. The second step is the free radical peroxide induced addition polymerization of the alkene or alkyne terminated polyorganosiloxane with the carbon to carbon double bonds of the fluoroelastomer. In embodiments, copper oxide can be added to a solution containing the graft copolymer.

In embodiments, the polyorganosiloxane having functionality according to the present invention has the formula:

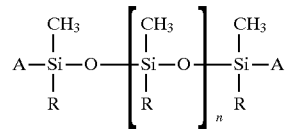

where R is an alkyl from about 1 to about 24 carbons, or an alkenyl of from about 2 to about 24 carbons, or a substituted or unsubstituted aryl of from about 4 to about 18 carbons; A is an aryl of from about 6 to about 24 carbons, a substituted or unsubstituted alkene of from about 2 to about 8 carbons, or a substituted or unsubstituted alkyne of from about 2 to about 8 carbons; and n represents the number of segments and is, for example, from about 2 to about 400, and preferably from about 10 to about 200 in embodiments.

In preferred embodiments, R is an alkyl, alkenyl or aryl, wherein the alkyl has from about 1 to about 24 carbons, preferably from about 1 to about 12 carbons; the alkenyl has from about 2 to about 24 carbons, preferably from about 2 to about 12 carbons; and the aryl has from about 6 to about 24 carbon atoms, preferably from about 6 to about 18 carbons. R may be a substituted aryl group, wherein the aryl may be substituted with an amino, hydroxy, mercapto or substituted with an alkyl having for example from about 1 to about 24 carbons and preferably from 1 to about 12 carbons, or substituted with an alkenyl having for example from about 2 to about 24 carbons and preferably from about 2 to about 12 carbons. In a preferred embodiment, R is independently selected from methyl, ethyl, and phenyl. The functional group A can be an alkene or alkyne group having from about 2 to about 8 carbon atoms, preferably from about 2 to about 4 carbons, optionally substituted with an alkyl having for example from about 1 to about 12 carbons, and preferably from about 1 to about 12 carbons, or an aryl group having for example from about 6 to about 24 carbons, and preferably from about 6 to about 18 carbons. Functional group A can also be mono-, di-, or trialkoxysilane having from about 1 to about 10 and preferably from about 1 to about 6 carbons in each alkoxy group, hydroxy, or halogen. Preferred alkoxy groups include methoxy, ethoxy, and the like. Preferred halogens include chlorine, bromine and fluorine. A may also be an alkyne of from about 2 to about 8 carbons, optionally substituted with an alkyl of from about 1 to about 24 carbons or aryl of from about 6 to about 24 carbons. The group n is from about 2 to about 400, and in embodiments from about 2 to about 350, and preferably from about 5 to about 100. Furthermore, in a preferred embodiment n is from about 60 to about 80 to provide a sufficient number of reactive groups to graft onto the fluoroelastomer. In the above formula, typical R groups include methyl, ethyl, propyl, octyl, vinyl, allylic crotnyl, phenyl, naphthyl and phenanthryl, and typical substituted aryl groups are substituted in the ortho, meta and para positions with lower alkyl groups having from about 1 to about 15 carbon atoms. Typical alkene and alkenyl functional groups include vinyl, acrylic, crotonic and acetenyl which may typically be substituted with methyl, propyl, butyl, benzyl, tolyl groups, and the like.

Specifically, the fluoropolymer, preferably a fluoroelastomer, for the ohmic contact-providing composition is added in an amount of from about 60 to about 99 percent, preferably about 70 to about 99 percent by weight of total solids.

Any known solvent suitable for dissolving a fluoroelastomer may be used in the present invention. Examples of suitable solvents for the present invention include methyl ethyl ketone, methyl isobutyl ketone, diethyl ketone, cyclohexanone, n-butyl acetate, amyl acetate, and the like. Specifically, the solvent is added in an amount of from about 25 to about 99 percent, preferably from about 70 to about 95 percent by weight of total solids.

The dehydrofluorinating agent which attacks the fluoroelastomer generating unsaturation is selected from basic metal oxides such as MgO, CaO, $Ca(OH)_2$ and the like, and strong nucleophilic agents such as primary, secondary and tertiary, aliphatic and aromatic amines, where the aliphatic and aromatic amines have from about 2 to about 30 carbon atoms. Also included are aliphatic and aromatic diamines and triamines having from about 2 to about 30 carbon atoms where the aromatic groups may be benzene, toluene, naphthalene, anthracene, and the like. It is generally preferred for the aromatic diamines and triamines that the aromatic group be substituted in the ortho, meta and para positions. Typical substituents include lower alkyl amino groups such as ethylamino, propylamino and butylamino, with propylamino being preferred. The particularly preferred curing agents are the nucleophilic curing agents such as VITON CURATIVE VC-50® which incorporates an accelerator (such as a quaternary phosphonium salt or salts like VC-20) and a crosslinking agent (bisphenol AF or VC-30); DIAK 1 (hexamethylenediamine carbamate) and DIAK 3 (N,N'-dicinnamylidene-1,6 hexanediamine). The dehydrofluorinating agent is added in an amount of from about 1 to about 20 weight percent.

The fluorinated carbon filled fluoropolymer ohmic contact-providing compositions can be formed into a composition layer by well known methods including solvent-casting the dispersions of fluorinated carbon in solutions containing the dissolved fluoropolymer and using conventional deposition techniques such as dip coating, spraying, gravure coating, and the like.

In an embodiment of the present invention, the ohmic contact-providing composition of the present invention is formed into a composition layer and used as an ohmic contact-providing layer or hole injecting layer. In a preferred embodiment of the invention as depicted in FIG. 1, a conductor 1 is shown which may include a substrate 2, on the optional substrate is a fluorinated carbon filled fluoroelastomer ohmic contact-providing layer 3 in accordance with the present invention, having thereon a charge transport layer 4. An optional top surface collecting contact layer 5 may be present on the charge transport layer 4. The top surface collecting contact is required for current continuity. The ohmic contact-providing layer ensures that the current is controlled entirely by the properties of the transport layer.

Suitable substrate materials for use herein include any material having the requisite mechanical properties including biaxially oriented polyester sheets or webs, polyimide, aluminum, stainless steel, brass, glass, ceramic substrates, and the like. Biaxially oriented refers to having two, typically orthogonal, favored directions for chain alignment. This is often achieved by drawing a polymer film along two mutually perpendicular directions so that the ordering is induced in two dimensions. The substrate may comprise a layer of non-conducting material such as biaxially oriented polyester sheets or webs, polyimide, glass, ceramic substrates, and the like; a layer of an organic or inorganic polymeric material having a conductive surface layer arranged thereon wherein the polymeric material may be for example, polyimide, biaxially oriented polyester sheets or webs, and the like; or a conductive material such as, for example, aluminum, brass, gold, steel, and the like.

The thickness of the substrate layer depends on many factors, including economic considerations, and may be from about 1 mil to about 100 mils, preferably from about 3 to about 10 mils.

The substrate is typically supplied from readily available commercial sources. The fluorinated carbon filled fluoropolymer ohmic contact layer may be deposited on the substrate by well-known methods including dip coating, spraying, draw bar coating, gravure coating, and the like, to a typical thickness of from about 0.50 $\mu$m to about 100 $\mu$m or more essentially depending on requirements imposed by device design.

In a preferred embodiment of the invention, a charge transport layer is present on the ohmic contact-providing layer. The charge carrier transport layer can be of any number of suitable materials which are capable of transporting holes. The charge transport layer is comprised of polymeric or non-polymeric electrically active materials (known in the art as "small molecules"). The electrically active small molecules are dispersed in an electrically inactive resin (referred to hereinafter as the "electrically inactive resin") to form a layer which will transport holes. Examples of small molecules which are electrically active non-polymeric materials include those having the following formula:

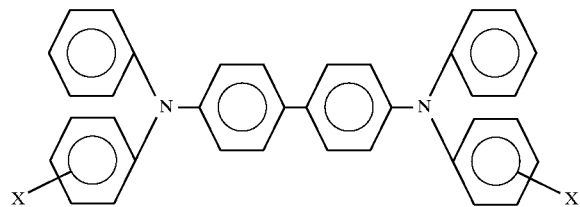

wherein X is an alkyl or a halogen such as (ortho) $CH_3$, (meta) $CH_3$, (para) $CH_3$, (ortho) Cl, (meta) Cl, and (para) Cl. Preferably the diamine is dispersed in a resin. Examples include the following: N,N'-diphenyl-N,N'-bis (alkylphenyl)-[1,1'-biphenyl]-4,4'-diamine, wherein alkyl is selected from the group consisting of methyl such as 2-methyl, 3-methyl and 4-methyl, ethyl, propyl, butyl, hexyl and the like; N,N'-diphenyl-N,N'-bis(halo phenyl)-[1,1'-biphenyl]-4,4'-diamine, wherein the halo atom is 2-chloro, 3-chloro or 4-chloro; N,N'-diphenyl-N,N'-bis-(2-methylphenyl)-[2,2'-dimethyl-1,1'-diphenyl]-4,4'-diamine; N,N,N'N'-tetraphenyl[2,2'-dimethyl-1,1'-diphenyl]-4,4'-diamine; 14-bis[bis-4'-phenylmethylamino-2'-methylphenyl)methyl]benzene; N,N'-diphenyl-N,N'-bis(3-methylphenyl)[p-terphenyl]-4,4"-diamine; 2,5-bis (4'dimethylaminophenyl)-1-ethyl-1,3,4-triazole; 2,5-bis(4'-dimethylaminophenyl)-1,3,4-oxidiazole; N,N,N'N'-tetraphenyl[1,1'-diphenyl]-4,4'-diamine; and the like. Other electrically active small molecules which can be dispersed in an electrically inactive resin to form a layer which will transport holes include triphenylmethane; bis(4-diethylamino-2-methylphenyl) phenylmethane; 4,4"-bis (diethylamino)-2',2"-dimethyltriphenyl methane; bis-4 (diethylaminophenyl) phenylmethane; and 4,4'-bis (diethylamino)-2,2'-dimethyltriphenylmethane.

Other examples of small molecules include all aromatic amine based charge transporting small molecules known in the art of electrophotography and organic electroluminescence including compounds disclosed in the European Patent Application 0 650 955 A1, the entire disclosure of which is hereby incorporated by reference.

The above "small molecule" which is electrically active is dispersed in a highly insulating and transparent organic resinous electrically inactive organic polymer material to make up the charge transporting layer. Examples of electrically inactive binder resinous material include those described by Middleton, et al. in U.S. Pat. No. 3,121,006, which is hereby incorporated by reference in its entirety. The resinous material contains from about 10 to about 75 weight percent of the electrically active "small molecule" material corresponding to the foregoing and from about 90 to about 25 weight percent of the electrically inactive resinous material. Examples of electrically inactive resin materials include polycarbonate resins, acrylate polymers, polymethacrylates, vinyl polymers, cellulose polymers, polyarylethers polyesters, polysiloxanes, polyamides, polyurethanes, poly(styrene), poly(oxy-2,6-dimethyl-1,4-phenylene), polyolefins, and epoxies as well as block, random or alternating copolymers thereof. Preferred electrically inactive resins are polycarbonates having a molecular weight of from about 20,000 to about 150,000, preferably from about 20,000 to about 100,000. Specific examples of suitable polycarbonates include a polycarbonate resin such as poly (4,4"-isopropylidene-diphenylene carbonate) and phenolphthalein polycarbonate. Preferred commercially available polycarbonate resins include Lexan 145 having a molecular weight of from about 25,000 to about 40,000, Lexan 141 having a molecular weight from about 40,000 to 45,000, both of these materials are available from the General Electric Company; and MAKROLON® having a molecular weight from about 50,000 to about 120,000 available from Farbenfabricken Bayer AG; and Merlon having a molecular weight of about 20,000 to about 50,000 available from Mobay Chemical Company. Examples of polymeric charge transport layers used to form ohmic contact are those listed in U.S. Pat. No. 4,806,443 to Yanus, Spiewak, Limburg and Renfer, and U.S. Pat. No. 5,230,976 to Schank and Yanus, the disclosures both of which are hereby incorporated by reference in their entirety.

The details of preparation of preferred diamine/polycarbonate charge transport layers are set forth in U.S. Pat. No. 4,265,990, the disclosure of which is hereby incorporated by reference in its entirety. The charge transport layer can be deposited onto the ohmic contact layer by well known methods such as dip coating, spraying, gravure coating, and the like.

The charge transport layer has a thickness of from about 5 to about 50 microns and preferably from about 15 to about 40 microns.

Figure 2:
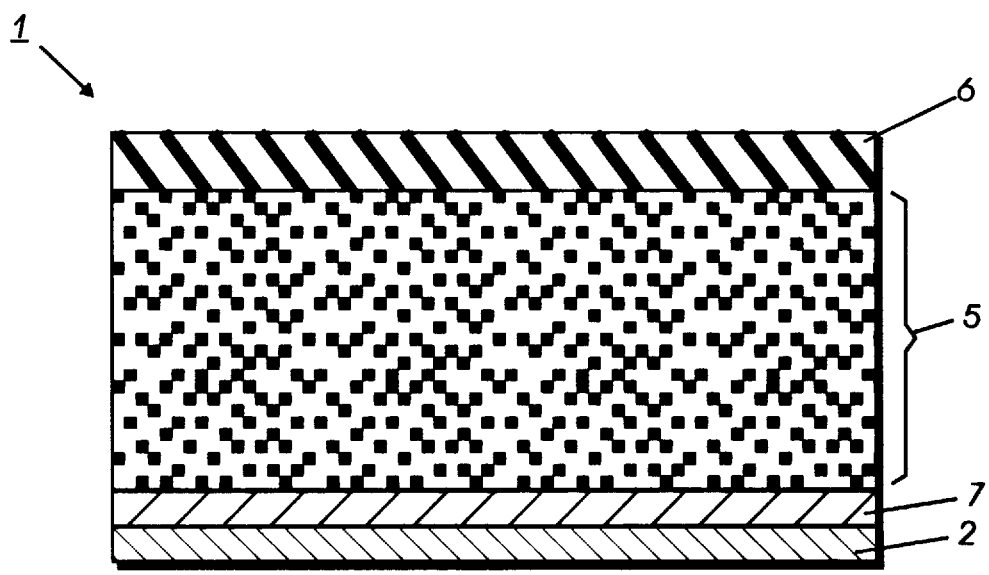
FIG. 2 depicts another embodiment of the invention wherein a conductor comprises an optional substrate, an optional collecting contact layer, a charge transport layer and thereon, an ohmic contact-providing layer.

In another preferred embodiment of the invention as depicted in FIG. 2, a fluorinated carbon filled fluoroelastomer ohmic contact layer 6 is present on a charge transport layer 5. The charge transport layer could be a diamine/polycarbonate layer as described herein. The transport layer 5 is present on an optional collecting contact layer 7 which is present on the substrate 2. In this case the substrate is the collecting contact. Examples of collecting contact layers include aluminum, gold, copper, and other suitable metals, along with metal oxides such as indium tin oxide, and the like. The ohmic contact providing layer ensures that the current is controlled entirely by the properties of the transport layer.

Figure 5:
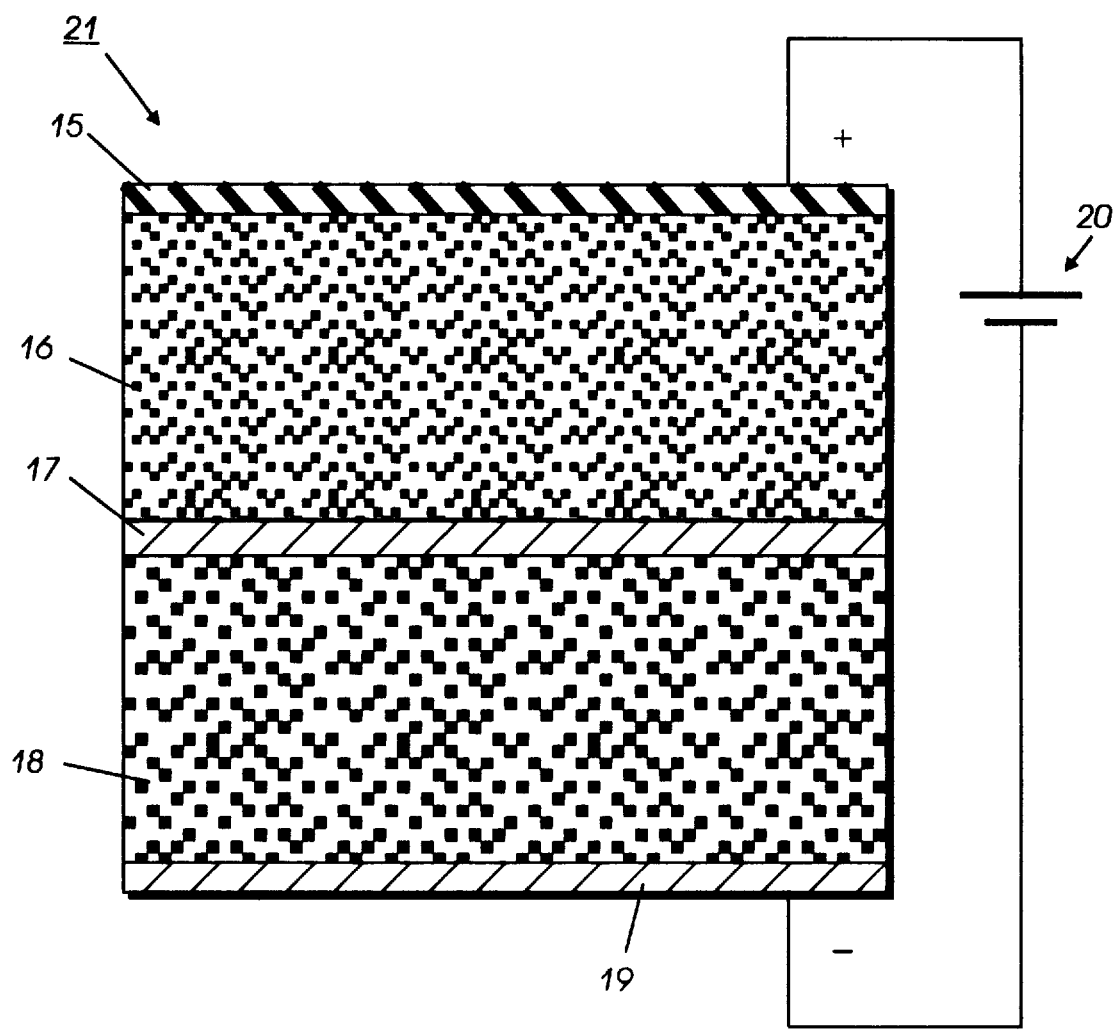
FIG. 5 is a schematic illustration of the use of a fluorinated carbon filled fluoroelastomer as a hole injecting contact to an organic multilayer light emitting diode (OLED).

FIG. 5 is a schematic illustration of the use of a fluorinated carbon filled fluoroelastomer as an ohmic contact-providing contact 15 to an organic multilayer light emitting diode 21. The illustration shows a fluorinated carbon filled fluoroelastomer hole injecting contact layer 15 over a hole transport layer 16, which in turn, is positioned over a recombination zone or emitter 17. The zone 17 is positioned on an electron transport layer 18 which is positioned on an electron injecting contact or substrate 19. The light emitting diode 21 is connected to a circuit 20. The composition of the hole injecting contact can be adjusted so that it operates as either ohmic in which case the hole current is controlled by the properties of the hole transport layer, or emission limiting in which case the contact interface controls the hole current. The latter condition may be required to achieve balanced injection and thereby optimize performance of this particular device.

In an embodiment of the present invention, the fluorinated carbon filled fluoropolymer ohmic contact-providing layer or composition can be used in a light emitting diode. This light emitting diode embodiment includes a substrate 19 comprising semitransparent metal such as semitransparent aluminum or semitransparent magnesium and thereon, a vapor-deposited electron transport layer 18 comprising 8-hydroxyquinoline aluminum or 2-biphenyl-5-p-t.-butylphenyl oxadiazole, their derivatives, or any other electron transporting small molecule known in the art of organic light emitting diodes such as bis(10-hydroxybenzo[h]-quinolate) beryllium, tris(7-n-propyl-8-hydroxyquinoline) aluminum, 1,3-(bis-5-p-t.-butyl phenyl-2-oxadiazolyl) benzene, 2,5-bis(5-t.-butyl-2-benzoxazolyl)thiophene, etc., and, optionally, an emitter layer 16 sandwiched between a hole transport layer 16 and the electron transport layer 18. The emitter or recombinant zone comprises fluorescent dye molecules such as Coumarin 6 and many other dyes and emitters known in the art. The hole injecting layer 16 can be alkyl amine/polycarbonate. Provided on the hole injecting layer is the ohmic contact-providing composition comprising a fluorinated carbon filled fluoroelastomer herein. The electrode is protected from the environment by a layer of glass or any other transparent oxygen and water impermeable material.

The present fluorinated carbon filled fluoropolymer compositions can also be useful as ohmic contacts in field effect transistors. Suitable examples of field effect transistors are described in the published literature in, for example, FIG. 1 of G. Horowitz, *Advanced Materials* Vol. 8, page 177 (1996), and references therein. The entire disclosure of the G. Horowitz reference is incorporated herein by reference.

The ohmic contact-providing compositions as described herein are also useful in related devices requiring ohmic contact, for example, chemical sensors such as those described in Ohmori et al., *Japanese Journal of Appl. Phys.* 30, L1247 (1991) and Lee et al., *Bull. Chem. Soc. Jpn.* Vol. 64, page 2019 (1991), the disclosures both of which are incorporated herein by reference in their entirety. In all of the above, compositions of the present invention would be used in fabricating the required contact structures.

Depending on requirements defined by the details of device design, volume resistivity of the contact composition could range from $10^{-10}$-$10^{-1}$ ohm-cm. The resistivity can be controlled by varying the amount and type of fluorinated carbon.

The ohmic contact-providing compositions of the present invention comprise a fluorinated carbon filled fluoropolymer. The ohmic contact-providing compositions are compositions which provide perfect (ohmic) injecting contacts to a variety of insulating transport polymers. Further, these ohmic contact-providing compositions retain ohmic contact on the same transport polymer even after the transport polymers have been rendered conductive by chemical modification. The ohmic contact-providing compositions herein provide ohmic contact in any active organic device that depends for its operation on contact to an external circuit. In addition, the ohmic contact-providing compositions do not impede the flow of current from an electrical source to an operating device.

All the patents and applications referred to herein are hereby specifically, and totally incorporated herein by reference in their entirety in the instant specification.

The following Examples further define and describe embodiments of the present invention. Unless otherwise indicated, all parts and percentages are by weight.

EXAMPLES

Example I

A contact layer interfaced with a typical hole transport layer was prepared as follows. The coating dispersion of the ohmic contact layer was prepared by dissolving 45 grams of VITON® GF and dispersing 20 grams of ACCUFLUOR® 2028 in 200 grams of methyl ethyl ketone (MEK) in a small bench top attritor (Model 01A). After adding 2,300 grams of ⅜ inch steel shot, the attritor was run at a slow speed for 30 minutes while checking periodically to insure proper mixing. The curative package (2.25 grams VC-50, 0.9 grams Maglite-D and 0.2 grams CA(OH)$_2$) and a stabilizing solvent (10 grams methanol) were then introduced and the resulting mixture was further mixed for another 15 minutes in the attritor at high speed. After filtering the steel shot through a wire screen, the dispersion was collected in an 8 ounce polypropylene bottle. The resulting dispersion was then coated onto a polyimide substrate within 2 to 5 hours and the coatings were air dried for several hours. The resulting layers were post cured in a programmable oven. The heating sequence was as follows: (1) 65° C. for 4 hours, (2) 93° C. for 2 hours, (3) 144° C. for 2 hours, (4) 177° C. for 2 hours, (5) 204° C. for 2 hours and (6) 232° C. for 16 hours.

The resulting layers were then overcoated with a 21 μm thick 50 weight percent (N,N'-diphenyl-N,N'-bis(3-methylphenyl)-[1,1'-bisphenyl]-4,4'-diamine)/MAKROLON® polycarbonate layer cast from methylene chloride solution. This coating solution was prepared by dissolving 5 grams of "N,N'-diphenyl-N,N'-bis(3-methylphenyl)-[1,1'-bisphenyl]-4,4'-diamine and 5 grams of bisphenol A polycarbonate MAKROLON® in 50 grams methylene chloride and the solution was draw-bar coated on the contact layer. The transport layer was dried in an oven at 80° C. for 8 hours and cast from methylene chloride solution and dried at 100° C. for 3 hours. A top electrically blocking contact of semitransparent about 0.1 microns in thickness aluminum was then vapor-deposited.

The experimental techniques used are described in M. Abkowitz in "Journal of Imaging Science and Technology" 40,319 (1996) and references therein. Time-of-flight measurements of transit time described in the above reference were made by photoexcitation through a positively biased semitransparent aluminum contact. The values of transit time were used to calculate the trap-free space charge limited current that an ohmic contact would be expected to inject under prevailing conditions. The latter were then directly compared to the positive injection current density sustained by the fluorinated carbon filled fluoropolymer compositions of the present invention, under identical bias conditions. The ohmicity of the polymer composition contact was thereby unambiguously demonstrated as shown in FIG. 4 wherein it is clear that voltage and amps increased at the same rate. This demonstrated 100% ohmicity.

Example II

The process as set out in Example I was repeated except that the fluorinated carbon filled fluoroelastomer was overcoated onto a stainless steel substrate instead of a polyimide substrate.

The agreement between calculated and measured values of injected current demonstrate contact ohmicity as in Example 1.

The following examples repeat the experimental demonstration with similar agreement between current calculated and measured to establish ohmicity.

Example III

The process as set out in Example I was repeated except that the charge transport layer was comprised of 50% N,N'-bis(4-methylphenyl)-N,N'-bis(4 ethylphenyl)-[1,1'-(3,3'dimethyl)biphenyl]-4,4'-diamine in bisphenol A polycarbonate (MAKROLON®). As in the Example I, the measured current densities were found to be identical to the current densities calculated from the formula (1) using the known hole drift mobilities, thus indicating that perfectly ohmic contact was achieved.

Example IV

The process as set out in Example I was repeated except that the charge transport layer was comprised of 30% N,N'-bis(4-methylphenyl)-N,N'-bis(4 ethylphenyl)-[1,1'-(3,3'dimethyl)biphenyl]-4,4'-diamine in polystyrene, and was draw-bar coated from toluene solution. Again, the existence of a perfectly ohmic contact was demonstrated by the coincidence of the measured values of current densities with values calculated from the Formula (1).

Example V

The process as set out in Example I was repeated except that the charge transport layer was comprised of a charge transport polymer whose structure is shown below:

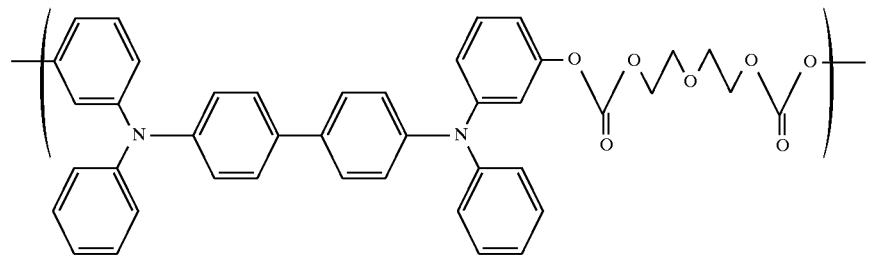

A 25 μm thick layer was draw-bar coated from methylene chloride solution. The existence of a perfectly ohmic contact was demonstrated by the coincidence of the measured values of current densities with values which were calculated from the Formula (1).

Example VI

The steps set out in Example I were repeated except that the charge transport layer was comprised of a charge transport polymer whose structure is shown below.

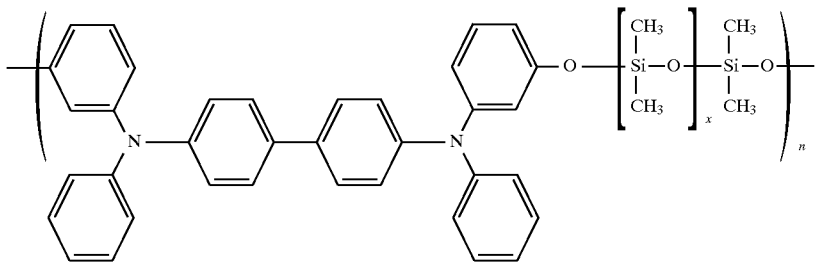

wherein x=1–10, preferably 1–6, and herein 3. The variable n is the number of repeating units of the polymer and can be from 5 to 10,000. and herein is 4,000. A 25 μm thick layer was draw-bar coated from toluene solution. Again, the existence of a perfectly ohmic contact was demonstrated by the coincidence of the measured values of current densities with values which were calculated from the Formula (1) using known charge carrier mobilities for this polymer.

While the invention has been described in detail with reference to specific and preferred embodiments, it will be appreciated that various modifications and variations will be apparent to the artisan. All such modifications and embodiments as may readily occur to one skilled in the art are intended to be within the scope of the appended claims.

We claim:

1. A component comprising a charge transport layer and a fluorinated carbon filled fluoropolymer layer.

2. A component in accordance with claim 1, wherein said fluorinated carbon is present in an amount of from about 1 to about 50 percent by weight based on the weight of total solids.

3. A component in accordance with claim 1, wherein the fluorinated carbon has a fluorine content of from about 5 to about 65 weight percent based on the weight of fluorinated carbon, and a carbon content of from about 95 to about 35 weight percent based on the weight of the fluorinated carbon.

4. A component in accordance with claim 1, wherein the fluorinated carbon is of the formula $CF_x$, wherein x represents the number of fluorine atoms and is from about 0.02 to about 1.5.

5. A component in accordance with claim 1, wherein said fluorinated carbon is selected from the group consisting of a fluorinated carbon having a fluorine content of 62 weight percent, a fluorinated carbon having a fluorine content of 11 weight percent, a fluorinated carbon having a fluorine content of 28 weight percent, and a fluorinated carbon having a fluorine content of 65 weight percent based on the weight of fluorinated carbon.

6. A component in accordance with claim 1, wherein the fluoropolymer is a fluoroelastomer selected from the group consisting of a) copolymers of vinylidenefluoride, hexafluoropropylene and tetrafluoroethylene, b) terpolymers of vinylidenefluoride, hexafluoropropylene and tetrafluoroethylene, and c) a tetrapolymers of vinylidenefluoride, hexafluoropropylene, tetrafluoroethylene and a cure site monomer.

7. A component in accordance with claim 6, wherein the fluoroelastomer comprises 35 mole percent of vinylidenefluoride, 34 mole percent of hexafluoropropylene and 29 mole percent of tetrafluoroethylene.

8. A component in accordance with claim 1, wherein the fluoroelastomer is present in an amount of from about 70 to about 99 percent by weight based on the weight of total solids.

9. A component in accordance with claim 1, wherein the fluorinated carbon is of the formula $CF_x$, wherein x represents the number of fluorine atoms and is from about 0.02 to about 1.5 and the fluoroelastomer comprises 35 mole percent of vinylidenefluoride, 34 mole percent of hexafluoropropylene and 29 mole percent of tetrafluoroethylene.

10. A conductor comprising: a) a substrate and thereover, b) an ohmic contact-providing layer comprising a fluorinated carbon filled fluoropolymer and thereon, c) a charge transport layer.

11. A conductor in accordance with claim 10, wherein the fluorinated carbon has a fluorine content of from about 5 to about 65 weight percent based on the weight of fluorinated carbon, and a carbon content of from about 95 to about 35 weight percent based on the weight of fluorinated carbon.

12. A conductor in accordance with claim 10, wherein the fluorinated carbon is of the formula $CF_x$, wherein x represents the number of fluorine atoms and is from about 0.02 to about 1.5.

13. A conductor in accordance with claim 10, wherein said fluorinated carbon is selected from the group consisting of a fluorinated carbon having a fluorine content of 62 weight percent, a fluorinated carbon having a fluorine content of 11 weight percent, a fluorinated carbon having a fluorine content of 28 weight percent, and a fluorinated carbon having a fluorine content of 65 weight percent based on the weight of fluorinated carbon.

14. A conductor in accordance with claim 10, wherein the fluoropolymer of the ohmic contact-providing composition is a fluoroelastomer selected from the group consisting of a) copolymers of vinylidenefluoride, hexafluoropropylene and tetrafluoroethylene, b) terpolymers of vinylidenefluoride, hexafluoropropylene and tetrafluoroethylene, and c) tetrapolymers of vinylidenefluoride, hexafluoropropylene, tetrafluoroethylene and a cure site monomer.

15. A conductor in accordance with claim 14, wherein the fluoroelastomer of the ohmic contact-providing composition comprises 35 mole percent of vinylidenefluoride, 34 mole percent of hexafluoropropylene and 29 mole percent of tetrafluoroethylene.

16. A conductor in accordance with claim 10, wherein said substrate is selected from the group consisting of stainless steel, aluminum, gold, brass, polyimide, ceramic, and a biaxially oriented polyester.

17. A conductor in accordance with claim 10, wherein said charge transporting layer comprises a diamine of the following formula:

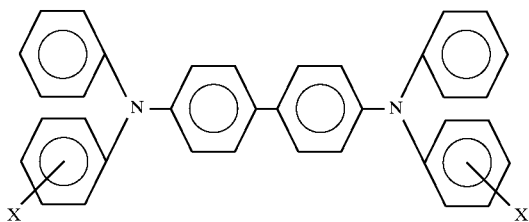

wherein X is selected from the group consisting of ortho CH$_3$, meta CH$_3$, para CH$_3$, ortho Cl, meta Cl, and para Cl, dispersed in a polycarbonate resin, wherein said polycarbonate resin has a molecular weight of from about 20,000 to about 150,000.

18. A conductor in accordance with claim 10, wherein said charge transporting layer comprises a diamine of the following formula:

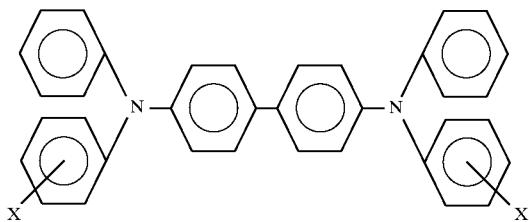

wherein X is selected from the group consisting of alkyl or halogen and wherein said diamine is dispersed in a resin binder.

19. A conductor comprising a charge transporting layer and thereover, an ohmic contact-providing layer comprising a fluorinated carbon filled fluoropolymer.

20. A conductor in accordance with claim 19, wherein the fluorinated carbon has a fluorine content of from about 5 to about 65 weight percent based on the weight of fluorinated carbon, and a carbon content of from about 95 to about 35 weight percent based on the weight of fluorinated carbon.

21. A conductor in accordance with claim 19, wherein the fluorinated carbon is of the formula CF$_x$, wherein x represents the number of fluorine atoms and is from about 0.02 to about 1.5.

22. A conductor in accordance with claim 19, wherein said fluorinated carbon is selected from the group consisting of a fluorinated carbon having a fluorine content of 62 weight percent, a fluorinated carbon having a fluorine content of 11 weight percent, a fluorinated carbon having a fluorine content of 28 weight percent, and a fluorinated carbon having a fluorine content of 65 weight percent based on the weight of fluorinated carbon.

23. A conductor in accordance with claim 19, wherein the fluoropolymer of the ohmic contact-providing composition is a fluoroelastomer selected from the group consisting of a) copolymers of vinylidenefluoride, hexafluoropropylene and tetrafluoroethylene, b) terpolymers of vinylidenefluoride, hexafluoropropylene and tetrafluoroethylene, and c) tetrapolymers of vinylidenefluoride, hexafluoropropylene, tetrafluoroethylene and a cure site monomer.

24. A conductor in accordance with claim 23, wherein the fluoroelastomer of the ohmic contact-providing composition comprises 35 mole percent of vinylidenefluoride, 34 mole percent of hexafluoropropylene and 29 mole percent of tetrafluoroethylene.

25. A conductor in accordance with claim 18, wherein said charge transporting layer comprises a diamine having the following formula:

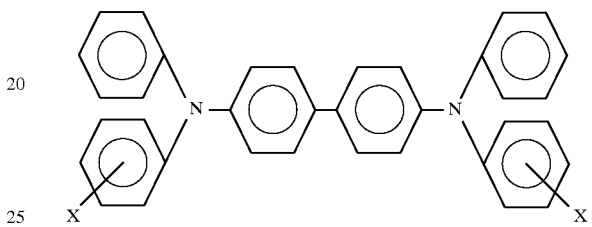

wherein X is selected from the group consisting of ortho CH$_3$, meta CH$_3$, para CH$_3$, ortho Cl, meta Cl, and para Cl, dispersed in a polycarbonate resin, wherein said polycarbonate resin has a molecular weight of from about 20,000 to about 150,000.

26. A light emitting diode comprising: a) a substrate selected from the group consisting of semitransparent aluminum and semitransparent magnesium and thereover, b) an electron transport layer comprising a compound selected from the group consisting of 8-hydroxyquiniline aluminum, 2-biphenyl-5-p-t-butylphenyl oxadiazole, and derivatives thereof, and provided on the electron transport layer, c) an optional emitter layer comprising at least one fluorescent dye material and provided thereon, d) a hole transport layer comprising an alkyl amine/polycarbonate, and thereon, e) an ohmic contact-providing layer comprising a fluorinated carbon filled fluoropolymer, wherein the fluorinated carbon is of the formula CF$_x$, wherein x represents the number of fluorine atoms and is from about 0.02 to about 1.5.

27. A process for providing an ohmic contact comprising providing a substrate, and thereover a charge transport layer and a fluorinated carbon filled fluoroelastomer layer.

* * * * *

UNITED STATES PATENT AND TRADEMARK OFFICE
CERTIFICATE OF CORRECTION

PATENT NO. : 5,856,013
DATED : January 5, 1999
INVENTOR(S) : Abkowitz et al.

It is certified that error appears in the above-identified patent and that said Letters Patent is hereby corrected as shown below:

Column 1, line 15, at the end of the "CROSS REFERENCE T RELATED APPLICATIONS" insert --The disclosure of each of these references are hereby incorporated by reference in their entirety--.

Column 7, line 34, after "(1982)" insert --the disclosure of which is also incorporate herein by reference in it's entirety--.

Item [57], line 1, replace "a" with --an--.

Signed and Sealed this

Twenty-third Day of February, 1999

Attest:

Q. TODD DICKINSON

*Attesting Officer*     Acting Commissioner of Patents and Trademarks

UNITED STATES PATENT AND TRADEMARK OFFICE
CERTIFICATE OF CORRECTION

PATENT NO. : 5,856,013
DATED : January 5, 1999
INVENTOR(S) : Martin A. Abkowitz, et. al.

It is certified that error appears in the above-identified patent and that said Letters Patent is hereby corrected as shown below:

Title page, item [73], Assignee: insert --Xerox Corporation, Stamford, CT.--.

Signed and Sealed this

Second Day of May, 2000

Attest:

Q. TODD DICKINSON

*Attesting Officer*  *Director of Patents and Trademarks*